United States Patent
Otsuka et al.

(10) Patent No.: US 8,007,692 B2
(45) Date of Patent: Aug. 30, 2011

(54) COATING LIQUID FOR NICKEL FILM FORMATION, NICKEL FILM, AND PRODUCTION METHOD THEREOF

(75) Inventors: Yoshihiro Otsuka, Ichikawa (JP); Masaya Yukinobu, Ichikawa (JP)

(73) Assignee: Sumitomo Metal Mining Co., Ltd., Tokyo (JP)

(*) Notice: Subject to any disclaimer, the term of this patent is extended or adjusted under 35 U.S.C. 154(b) by 536 days.

(21) Appl. No.: 11/922,319

(22) PCT Filed: Jun. 16, 2006

(86) PCT No.: PCT/JP2006/312666
§ 371 (c)(1),
(2), (4) Date: Dec. 17, 2007

(87) PCT Pub. No.: WO2006/135113
PCT Pub. Date: Dec. 21, 2006

(65) Prior Publication Data
US 2009/0035472 A1    Feb. 5, 2009

(30) Foreign Application Priority Data
Jun. 17, 2005  (JP) ................................ 2005-177186

(51) Int. Cl.
H01B 1/02    (2006.01)
(52) U.S. Cl. ............... 252/519.21; 252/500; 252/518.1; 252/519.3; 252/521.2; 427/77; 427/123; 427/461; 427/466
(58) Field of Classification Search .................. 252/500, 252/518.1, 519.21, 519.3, 521.2; 427/77, 427/123, 461, 466
See application file for complete search history.

(56) References Cited

U.S. PATENT DOCUMENTS

| | | | | |
|---|---|---|---|---|
| 4,587,038 A | * | 5/1986 | Tamura | 252/511 |
| 2004/0119801 A1 | * | 6/2004 | Suzuki et al. | 347/100 |
| 2007/0289479 A1 | * | 12/2007 | Iwase et al. | 106/1.22 |
| 2008/0134936 A1 | * | 6/2008 | Kamikoriyama et al. | 106/31.92 |
| 2008/0206488 A1 | * | 8/2008 | Chung et al. | 427/596 |

FOREIGN PATENT DOCUMENTS

| | | |
|---|---|---|
| JP | 63270474 | 11/1988 |
| JP | 11293196 | 10/1999 |
| JP | 2000185368 | 7/2000 |
| JP | 200208/4049 | 3/2002 |
| JP | 2002292791 | 10/2002 |
| JP | 2004043947 | 2/2004 |
| WO | 00/01862 | 1/2000 |
| WO | 03/032084 | 4/2003 |
| WO | WO03032084 A2 * | 4/2003 |

OTHER PUBLICATIONS

English Abstract of WO 2000/001862.
English Abstract of JP 63270474.
English Abstract of JP 2002292791.
English Abstract of JP 11293196.
English Abstract of JP 2000185368.
English Abstract of JP 2004043947.
English Abstract of JP 200208/4049.

* cited by examiner

Primary Examiner — Harold Y Pyon
Assistant Examiner — Haidung D Nguyen
(74) Attorney, Agent, or Firm — Dykema Gossett PLLC

(57) ABSTRACT

It is aimed at providing: a coating liquid for nickel film formation suitable for forming a nickel film combinedly possessing an excellent electroconductivity and an excellent film-forming ability (surface flatness), by a coating method, particularly inkjet printing; a nickel film obtained by using the nickel film formation coating liquid; and a production method of such a nickel film.

A coating liquid for nickel film formation comprises: nickel formate; and an amine based solvent having a boiling point within a range between 180° C. inclusive and 300° C. exclusive, as a main solvent, thereby allowing obtainment of a coating liquid for nickel film formation suitable for inkjet printing; and there can be obtained a uniform and flat nickel film having a low resistance and being excellent in film strength (adhesion force), by coating the nickel film formation coating liquid onto a substrate; drying the coated coating liquid; and subsequently calcining the dried coating liquid at a temperature of 200° C. or higher in an inert atmosphere or reducing atmosphere.

12 Claims, 2 Drawing Sheets

COATING LIQUID FOR NICKEL FILM FORMATION, NICKEL FILM, AND PRODUCTION METHOD THEREOF

TECHNICAL FIELD

The present invention relates to a coating liquid for nickel film formation, a nickel film, and a production method thereof. More particularly, the present invention relates to: a coating liquid capable of forming a nickel film having an excellent electroconductivity on a heat-resistant substrate such as made of glass and ceramic or the like by a coating method, particularly inkjet printing, conveniently and at a low cost; a nickel film formed by the coating liquid; and a production method thereof.

BACKGROUND ART

Typically, there have been used metal materials excellent in electroconductivity, as signal electrodes of a display device such as a liquid crystal display (LCD), an electroluminescence device (ELD), and a plasma display (PDP), and as electrodes of various circuit boards, such that copper, aluminum, silver, nickel, and the like are utilized depending on usages.

Here, as the conventional methods for forming metal electrodes, there have been widely used physical techniques such as a vacuum deposition method, and a sputtering method. These methods are capable of forming uniform metal films excellent in electroconductivity on substrates.

However, film formation apparatus to be used for the methods are based on vacuum vessels to become expensive, and require that the production apparatus are to be vacuumed for each film formation on a substrate, thereby exhibiting problems of production cost and mass-productivity. Further, it is required to form a resist and to conduct etching thereto so as to work a metal film into a predetermined pattern, which leads to an increased number of processes, thereby problematically lowering the productivity and leading to a higher cost.

To deal with the above-described problems, there have been proposed production methods (hereinafter called "coating methods" as the case may be) each configured to adopt a coating liquid for electroconductive film formation comprising a solvent containing silver or copper nanoparticles dispersed therein, in patent documents 1 to 3, respectively. According to such methods, there are formed electroconductive films such as made of silver, copper, and the like, by a simple production process including coating, drying, and calcining of a coating liquid for electroconductive film formation onto and on a substrate. This has been carried out, by successfully utilizing such a tendency that fine particles of silver, copper, and the like are fusion bonded to one another even at low temperatures by virtue of effects of nanoparticle sizes of them.

Although the coating methods can be applied to nanoparticles susceptible to fusion bonding, there is deteriorated a quality of an obtained film (i.e., the film is porous) in case of a metal insusceptible to fusion bonding such as nickel particles, so that the coating methods have not been put into a practical use except for usage where calcining is conducted at a high-temperature of about 1,000° C. such as in case of a multilayer ceramic capacitor. Further, since nickel is ferromagnetic, nickel fine particles tend to aggregate in a coating liquid when the coating liquid is low in viscosity, thereby also exhibiting a problem of stability of the coating liquid.

Thus, as a coating liquid which has improved the problems, there has been proposed a nickel film formation paste which adopts a molecular nickel source obtained by dissolving nickel formate in monoethanol amine (2-amino ethanol) (boiling point: 171° C.) as described in a patent document 4, for example. Further, there has been proposed a nickel film formation paste in a patent document 5, which is obtained by dissolving organic nickel such as nickel acetate in a glycol based solvent. According to these methods, the pastes are printed by screen printing, for example, and fired at temperatures at about 400° C. in a nitrogen gas to obtain nickel electroconductive films, respectively.

Incidentally, extensive researches have been recently conducted for inkjet printing as a method for carrying out coating and forming of a fine pattern with an excellent resolution upon formation of an electroconductive film based on a coating method, and coating liquids therefor have been thus sought for, which are excellent in ink jetting ability, which are excellent in film-forming ability, which are free of occurrence of defects such as cising (phenomenon where a coating liquid is decreased to a size smaller than a printed pattern, due to defective wettability of the coating liquid) and bleeding (phenomenon where a coating liquid is spread to a size wider than a printed pattern, due to excessive wettability of the coating liquid), and which are excellent in film characteristics such as electroconductivity.

However, screen printing is assumed and the coating liquids are each high in viscosity in case of the nickel film formation paste of the patent document 4 obtained by dissolving formic acid in monoethanol amine and the nickel film formation paste of the patent document 5 obtained by dissolving organic nickel such as nickel acetate in a glycol based solvent, so that these pastes fully fail to conform to a viscosity of as low as about 5 to 20 mPa·s assumed to be optimum for ink jetting ability in case of inkjet printing, resulting in failure of application of the pastes to inkjet printing.

Further, even if the patent document 4 is altered to prepare a nickel film formation ink having a low viscosity by adopting nickel formate and monoethanol amine, such an ink will be poor in film-forming ability and unsatisfactory in densification degree of a film, thereby failing to obtain a nickel electroconductive film which possesses sufficient film characteristics (combined possession of all of appropriate resistance value, film strength, film uniformity, surface roughness, and the like). Moreover, monoethanol amine is a deleterious substance such that the coating liquid containing monoethanol amine in excess of 20% is also classified as a deleterious substance, thereby also exhibiting a defect of inferior handling ability.

Here, in case of preparation of a nickel film formation ink having a low viscosity by nickel formate and an amine based solvent, the amine based solvent is alkaline, thereby bringing about a possibility that a substrate to which the ink is applied is deteriorated depending on the nature of the substrate because the amine based solvent acts as alkali. Examples of substrates susceptible to degradation by alkali include silicon oxide based ones. Thus, depending on substrates to be adopted, it has been additionally required to decrease the blending amount of an amine based solvent as less as possible in a nickel film formation ink.

Further, there has been desired film formation at lower temperatures (such as about 200 to 250° C.), because achievement thereof enables a widened applicability of a nickel film formation ink in case of forming a nickel film by coating the nickel film formation ink onto a substrate.

Patent document 1: JP-A-2002-334618
Patent document 2: JP-A-2002-338850
Patent document 3: JP-A-2003-103158
Patent document 4: JP-A-2005-026479
Patent document 5: JP-A-2004-265826

DISCLOSURE OF THE INVENTION

Problem to be Solved by the Invention

It is therefore an object of the present invention to provide: a coating liquid for nickel film formation capable of forming a nickel film combinedly having an excellent electroconductivity and an excellent film-forming ability (surface flatness) by a coating method, particularly inkjet printing, conveniently and at a low cost; a nickel film obtained by using the coating liquid; and a production method thereof.

Means for Solving the Problem

To achieve the above object, the present invention provides a coating liquid for nickel film formation recited in a first aspect comprising:
nickel formate; and
an amine based solvent having a boiling point within a range between 180° C. inclusive and 300° C. exclusive, as a main solvent.

The invention recited in a second aspect resides in the coating liquid for nickel film formation according to the first aspect, wherein the amine based solvent is an alkanol amine solvent and/or glycol amine solvent.

The invention recited in a third aspect resides in the coating liquid for nickel film formation according to the second aspect, wherein the amine based solvent is 3-amino-1-propanol (boiling point: 188° C.).

The invention recited in a fourth aspect resides in the coating liquid for nickel film formation of any one of the first aspect through the third aspect, further comprising a binder component and/or surfactant.

The invention recited in a fifth aspect resides in the coating liquid for nickel film formation of the fourth aspect, wherein the binder component has an amino group ($-NH_2$), an amine group (functional group obtained by substituting one, two, or three hydrogen atoms of ammonia with one, two, or three alkyl groups [methyl group, ethyl group, and the like] or aryl groups [phenyl group and the like]) or the like.

The invention recited in a sixth aspect resides in the coating liquid for nickel film formation of the fourth aspect or the fifth aspect, wherein the surfactant is a silicone based surfactant having an HLB (hydrophile-lipophile balance) value of 10 or more.

The invention recited in a seventh aspect resides in the coating liquid for nickel film formation of any one of the first aspect through the sixth aspect, further comprising a solvent other than the amine based solvent.

The invention recited in an eighth aspect resides in the coating liquid for nickel film formation of the seventh aspect, wherein the solvent other than the amine based solvent contains therein, as a main component, at least one kind selected from dimethyl acetamide, ethylene glycol, dialkylene glycol monoalkyl ether (alkylene: ethylene and propylene, and alkyl: methyl, ethyl, and propyl), and water.

The invention recited in a ninth aspect resides in the coating liquid for nickel film formation of the seventh aspect, wherein the solvent other than the amine based solvent contains therein, as the main component, ethylene glycol and dialkylene glycol monoalkyl ether (alkylene: ethylene and propylene, and alkyl: methyl, ethyl, and propyl).

The invention recited in a tenth aspect resides in the coating liquid for nickel film formation of any one of the first aspect through the ninth aspect, further comprising a thermal decomposition promoter.

The invention recited in an eleventh aspect resides in the coating liquid for nickel film formation of the tenth aspect, wherein the thermal decomposition promoter is a palladium compound.

The invention recited in a twelfth aspect resides in the coating liquid for nickel film formation of any one of the first aspect through the eleventh aspect, wherein the coating liquid for nickel film formation is configured to have a viscosity within a range of 5 to 30 mPa·s at a room temperature.

The present invention further provides a nickel film production method recited in a thirteenth aspect comprising the steps of:
coating the coating liquid for nickel film formation of any one of the first aspect through the twelfth aspect onto a substrate;
drying the coated coating liquid; and
subsequently calcining the dried coating liquid at a temperature of 200° C. or higher in an inert atmosphere or reducing atmosphere.

The invention recited in a fourteenth aspect resides in the nickel film production method of the thirteenth aspect, wherein the drying step is conducted at a temperature of 150° C. or higher.

The invention recited in a fifteenth aspect resides in the nickel film production method of the thirteenth aspect or the fourteenth aspect, wherein the coating step is conducted by inkjet printing.

The present invention furthermore provides a nickel film recited in a sixteenth aspect obtained by the nickel film production method of any one of the thirteenth aspect through the fifteenth aspect.

The invention recited in a seventeenth aspect resides in the nickel film of the sixteenth aspect, wherein the nickel film has a specific resistance of 10 mΩ·cm or less.

Effect of the Invention

According to the coating liquid for nickel film formation of the present invention, it becomes possible to obtain a coating liquid having a viscosity suitable for a coating method such as inkjet printing, and excellent film-forming ability (printability) and liquid stability. Further, since the nickel film obtained by coating, drying, and calcining the coating liquid onto and on a heat-resistant substrate such as made of glass or ceramic is excellent in film strength and surface smoothness and possesses an excellent electroconductivity, so that the coating liquid can be utilized as electrodes of various displays such as LCD, ELD, and PDP, and electrodes of circuit boards.

BEST MODE FOR CARRYING OUT THE INVENTION

Embodiments of the present invention will be described hereinafter in detail.

In the present invention, nickel formate (chemical formula: $Ni(HCOO)_2$) is present as a nickel compound, in an actual form of anhydride:$Ni(HCOO)_2$ or hydrate:$Ni(HCOO)_2 \cdot 2H_2O$. By using a nickel film formation coating liquid containing, as a solvent, an amine based solvent therein having a boiling point between 180° C. inclusive and 300° C. exclusive, it becomes possible to readily form a nickel film on a substrate even when an inkjet printing method is adopted as a method for coating the coating liquid onto a substrate.

For carrying out the present invention, the present inventors have noticed the facts that: (a) among nickel compounds, nickel formate is thermally decomposed in a relatively low temperature range; (b) the solubility of nickel formate in an amine based solvent is notably increased with a temperature raised by heating; and (c) an amine based solvent having a relatively high boiling point is usable for delaying evaporation of the solvent to a certain extent.

Namely, in case of adopting a coating liquid for nickel film formation combinedly including an amine based solvent having a higher boiling point (180 to 300° C.) and nickel formate having a lower thermal decomposition temperature (240 to 270° C.) followed by coating onto a substrate or the like and heating and drying at a high temperature (150° C. or higher), the evaporation rate of the amine based solvent (volatilization of the amine based solvent) is relatively slow even when drying is progressed, thereby enabling to increase a solubility of nickel formate in the coating liquid during drying at the temperature raised by heating, while restricting evaporation of the amine based solvent (volatilization of the amine based solvent) to a certain extent.

As such, even when the concentration of the nickel formate is increased by heating and drying, deposition of nickel formate is hardly caused, thereby enabling obtainment of a dried coating film including densely packed nickel formate.

The present invention has been carried out based on such an idea to subject the dried coating film including densely packed nickel formate to additional thermal decomposition by calcining or the like, thereby further densifying the obtained nickel film.

Attention should be paid to the points that: 1) since a solvent has a certain vapor pressure even at a temperature below its boiling point, a solvent is typically and fully volatilized in a coating film at a heating temperature below the boiling point, thereby disadvantageously obtaining a dried film; and 2) even when a coated liquid is heated to a temperature at or above a boiling point of a solvent, the liquid is not raised to a temperature above the boiling point while evaporation is suddenly progressed, thereby failing to obtain a uniformly dried film.

The present inventors have taken notice of these points, and found out that the decomposition temperature (240 to 270° C.) of nickel formate and the boiling point (between 180° C. inclusive and 300° C. exclusive) of an amine based solvent are important, thereby narrowly carrying out the present invention.

As described above, the nickel compound used in the present invention is desirably nickel formate, since it decomposes at a low temperature (about 240 to 270° C.) in a neutral atmosphere such as nitrogen, argon or the like, to form nickel.

Further, the content of nickel formate in the coating liquid is preferably within a range of 3 to 40 wt %, and more preferably 5 to 20 wt %. Contents less than 3 wt % lead to decreased thicknesses of nickel films to thereby fail to obtain sufficient electroconductivity, and contents exceeding 40 wt % cause cracks to possibly lose electroconductivity.

Note that the content of nickel formate refers to a content of anhydrous nickel formate [$Ni(HCOO)_2$] herein.

The solvent to be used in the present invention preferably includes, as a main solvent, an amine based solvent capable of satisfactorily dissolving nickel formate therein, and having a boiling point between 180° C. inclusive and 300° C. exclusive. The amine based solvent as the main solvent is desirably an alkanol amine solvent and/or glycol amine solvent, which preferably has a hydroxyl group (—OH) at an end of its carbon chain, and which is concretely 3-amino-1-propanol (boiling point: 188° C.). It is also possible to add, to 3-amino-1-propanol, a small amount of 2-(2-aminoethylamino)ethanol (boiling point: 238 to 240° C./752 mmHg), 3-amino-1,2-propanediol (boiling point: 264 to 265° C./739 mmHg), diethanolamine (boiling point: 269° C.) or the like, which are amine based solvents having higher boiling points, respectively.

Here, nickel formate [$Ni(HCOO)_2$] has a solubility of as much as about 40 wt % even at 25° C. in 3-amino-1-propanol, for example, and heating the former to about 120° C. causes the solubility to be increased to at least 50 wt %, such that further heating increases the solubility more. It is thus important that although the amine based solvent to be used in the present invention is to desirably have a solubility equivalent to that of 3-amino-1-propanol, it is actually enough for the pertinent amine based solvent to have a higher solubility in a temperature range near the boiling point of the amine based solvent. In other words, in a case that an amine based solvent having a low boiling point exemplarily tends to volatilize in the course of temperature elevation during drying of a coating film such that the temperature elevation of the solvent is limited, it can be said that the solubility of nickel formate tends to become relatively low in an actual formation process of coating film even when the solubility of nickel formate is high to a certain extent at a low temperature.

Note that all the amine based solvents mentioned above are not classified as deleterious substances, respectively.

Further, the content of the amine based solvent in the coating liquid for nickel film formation is preferably within a range of 10 to 97 wt %, and more preferably 15 to 70 wt %.

Contents less than 10 wt % are undesirable, because this deteriorates the effect of the amine based solvent to dissolve therein and to stabilize nickel formate, thereby deteriorating the liquid stability of the coating liquid for nickel film formation and simultaneously deteriorating the denseness of the obtained nickel film, to deteriorate film characteristics (resistance value, flatness, strength, and the like). Only, since ethylene glycol has an effect to enhance solubility and stability of nickel formate when the amine based solvent is used combinedly with ethylene glycol as will be described later, it becomes possible to exceptionally lower the content of the amine based solvent down to a range of 5 wt % to 10 wt % or less without deteriorating the liquid stability of the coating liquid for nickel film formation and the characteristics of the nickel film to be obtained. It is desirable to decrease the blending amount of the amine based solvent as less as possible, when the coating liquid for nickel film formation is applied to a substrate susceptible to degradation by silicon oxide based alkali as described above.

Meanwhile, contents of the amine based solvent exceeding 97 wt % are physically impossible, because the content of nickel formate is made to be 3 wt % or less then. Only, as a general tendency, excessive contents of the amine based solvent are not so desirable, because such contents result in that (a) wettability is deteriorated depending on a kind of substrate (glass, for example), and (b) the viscosity of the coating liquid for nickel film formation is increased (about 100 mPa·s [25° C.], for example, which is caused by a higher viscosity of the amine based solvent itself), thereby exemplarily requiring such an endeavor to adopt an inkjet head having a built-in heater upon inkjet printing so as to conduct printing while heating the liquid to lower its viscosity.

Note that since an amine based solvent having a boiling point lower than 180° C. has a higher drying rate, the coating liquid adopting such an amine based solvent as a main solvent tends to cause cracks or considerable irregularities of a film as a result of rapid evaporation of the solvent upon drying the coating liquid at a high temperature (180° C., for example) after coating it, thereby tending to problematically and considerably deteriorate a film resistance value, a film strength, a film smoothness, a film uniformity, and the like. Further, although the problem of cracks is not caused when the drying temperature is lowered after coating, the densification of the film (nickel formate) then becomes insufficient, thereby rather disadvantageously causing problems of film resistance value, film strength, film smoothness, and the like.

In turn, an amine based solvent having a boiling point exceeding 300° C. is undesirable, since it has an excessively slow drying rate, so that the coating liquid adopting it as a main solvent leads to a considerably lengthened drying time upon drying the coating liquid at a high temperature (180° C., for example) after coating, and simultaneously leads to a tendency of residual solvent in the film. Further, even if the drying temperature is raised to enhance the drying rate of the solvent, decomposition of nickel formate is rather and simultaneously caused during drying of the coating liquid while causing occurrence of decomposition gases (steam, carbon dioxide, and the like), thereby tending to cause problems of considerable deterioration in film resistance value, film strength, film smoothness, film uniformity, and the like, similarly to the above.

Besides nickel formate and the amine based solvent, the coating liquid for nickel film formation to be used in the present invention may contain therein: a binder component; an organic solvent other than the amine based solvent; water; and the like, as required. Further, it is also possible to add thereto a surfactant, a high polymer in a small amount, for the purpose of further improving the film-forming ability of the coating liquid for nickel film formation.

It is enough for the binder to be used in the present invention to dissolve in the amine based solvent in a manner not to deteriorate the dissolution stability of nickel formate, and addition of such a binder enables improvement of adhesion force, flatness, and the like of the film. Examples of such a binder material include a high polymer, a silicon based coupling agent, a titanium based coupling agent, and the like. Among them, those coupling agents each having an amino group ($-NH_2$), an amine group (functional group obtained by substituting one, two, or three hydrogen atoms of ammonia with one, two, or three alkyl groups [methyl group, ethyl group, and the like] or aryl groups [phenyl group and the like]) or the like, are effective since they do not deteriorate the solubility of nickel formate. Examples of the silicon based coupling agent include 3-aminopropyl-trimethoxysilane, 3-aminopropyl-triethoxysilane, N-(2-aminoethyl)-3-aminopropyl-trimethoxysilane, N-(2-aminoethyl)-3-aminopropyl-triethoxysilane, N-(2-aminoethyl)-3-aminopropyl-methyldimethoxysilane, and N-(2-aminoethyl)-3-aminopropyl-dimethylmethoxysilane, and examples of the titanium based coupling agent include isopropyl-tri(N-aminoethyl-aminoethyl) titanate, without necessarily limited thereto.

Further, the adding amount of the binder is to be 0.05 to 20 parts by weight, preferably 1 to 15 parts by weight relative to 100 parts by weight of nickel formate [$Ni(HCOO)_2$]. Adding amounts less than 0.05 parts by weight fail to exhibit an effect of addition, and adding amounts exceeding 20 parts by weight are undesirable because it is then possible to exhibit an effect to improve the adhesion force, flatness, and the like of the film but the binder component is interposed among nickel fine particles to obstruct contact thereamong, thereby deteriorating electroconductivity of the film. Moreover, adopting a coupling agent as the binder leads to residue of inorganic component within the film even after calcining in a manner to join nickel fine particles to a substrate, thereby contributing to improving of an adhesion force of the film. Furthermore, addition of the binder also exhibits an effect to uniformalize growth of nickel fine particles during a calcining process, thereby also contributing to improving flatness of the film.

Examples of the organic solvent to be used in the present invention other than the amine based solvent are those which are within such a range to have a mutual solubility with the amine based solvent so as not to deteriorate the dissolution stability of nickel formate. Further, in case of conducting inkjet printing, it is naturally required to restrict a blending amount of a low boiling point solvent (boiling point of 100° C. or lower) to a smaller amount so as not to deteriorate the printability (initial jetting ability, intermittent jetting ability, and the like).

Namely, examples of the organic solvent include: alcohol based solvents such as methanol (MA), ethanol (EA), 1-propanol (NPA), isopropanol (IPA), butanol, pentanol, benzyl alcohol, diacetone alcohol (DAA); ketone based solvents such as acetone, methyl ethyl ketone (MEK), methyl propyl ketone, methyl isobutyl ketone (MIBK), cyclohexanone, isophorone; ester based solvents such as ethyl acetate, butyl acetate, isobutyl acetate, amyl formate, isoamyl acetate, butyl propionate, isopropyl butyrate, ethyl butyrate, butyl butyrate, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, methyl 3-oxypropionate, ethyl 3-oxypropionate, methyl 3-methoxypropionate, ethyl 3-methoxypropionate, methyl 3-ethoxypropionate, ethyl 3-ethoxypropionate, methyl 2-oxypropionate, ethyl 2-oxypropionate, propyl 2-oxypropionate, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, methyl pyruvate, ethyl pyruvate, propyl pyruvate, methyl acetoacetate, ethyl acetoacetate, methyl 2-oxobutanate, and ethyl 2-oxobutanate; glycol derivatives such as ethylene glycol monomethyl ether (MCS), ethylene glycol monoethyl ether (ECS), ethylene glycol isopropyl ether (IPC), ethylene glycol monobutyl ether (BCS), ethylene glycol monoethyl ether acetate, ethylene glycol monobutyl ether acetate, propylene glycol methyl ether (PGM), propylene glycol ethyl ether (PE), propylene glycol methyl ether acetate (PGMEA), propylene glycol ethyl ether acetate (PE-AC), diethylene glycol monomethyl ether, diethylene glycol monoethyl ether, diethylene glycol monobutyl ether, diethylene glycol monomethyl ether acetate, diethylene glycol monoethyl ether acetate, diethylene glycol monobutyl ether acetate, diethylene glycol dimethyl ether, diethylene glycol diethyl ether, diethylene glycol dibutyl ether, dipropylene glycol monomethyl ether, dipropylene glycol monoethyl ether, and dipropylene glycol monobutyl ether; amide based solvents such as formamide (FA), N-methyl formamide, dimethyl formamide (DMF), and dimethyl acetamide (DMAc); benzene derivatives such as toluene, xylene, mesitylene, and dodecyl benzene; and dimethylsulfoxide (DMSO), N-methyl-2-pyrrolidone (NMP), γ-butyrolactone, ethylene glycol, diethylene glycol, tetrahydrofuran (THF), chloroform, mineral spirits, and terpineol, without necessarily limited thereto. Among the above solvents, amide based solvents are desirable in that they keep liquid stability of an amine based solvent. Further, such an organic solvent is desirable which has a boiling point lower than that of at least one or more kinds of amine based solvents to be used in the coating liquid for nickel film formation, because the organic solvent volatilizes prior to the amine based solvents so that the amine based solvents satisfactorily dissolving nickel formate therein volatilize thereafter. Among the amide based solvents, dimethyl acetamide (boiling point: 166° C., surface tension: 32.4 dyn/ cm [30° C.], viscosity: 0.92 mPa·s [25° C.]) is preferable in that its boiling point is appropriately high and its surface tension and viscosity are low.

Here, examples of preferable solvents include dialkylene glycol monoalkyl ethers (alkylene: ethylene and propylene, and alkyl: methyl, and ethyl), because which exemplarily embrace diethylene glycol monomethyl ether (boiling point: 194° C., surface tension: 34.8 dyn/cm [25° C.] viscosity: 3.48 mPa·s [25° C.]), diethylene glycol monoethyl ether (boiling point: 202° C., surface tension: 31.8 dyn/cm [25° C.], viscosity: 3.71 mPa·s [25° C.]), diethylene glycol monopropyl ether (boiling point: 210° C., surface tension: 32.3 dyn/cm [20° C.], viscosity: 4.1 mPa·s [25° C.]), dipropylene glycol monomethyl ether (boiling point: 190° C., surface tension: 28.8 dyn/cm [25° C.], viscosity: 3.33 mPa·s [25° C.]), and dipropylene glycol monoethyl ether (boiling point: 198° C., surface tension: 27.7 dyn/cm [25° C.], viscosity: 3.34 mPa·s [25° C.]), because which each have a boiling point slightly higher than the boiling point of 188° C. of the above-mentioned 3-amino-1-propanol as the amine based solvent, and a surface tension and a viscosity lower than those of the amine based solvent, and because which each provide a coating liquid having a low viscosity and being excellent in film-forming ability when used combinedly with the 3-amino-1-propanol though the exact reason thereof is unknown.

Further, examples of preferable solvents also include ethylene glycol (boiling point: 197.6° C., surface tension: 48.4 dyn/cm [20° C.], viscosity: 20.9 mPa·s [20° C.]), because although ethylene glycol has a boiling point slightly higher than the boiling point 188° C. of the above-described 3-amino-1-propanol as the amine based solvent, ethylene glycol has a capability of assisting nickel formate in dissolution, so that blending ethylene glycol in the coating liquid for nickel film formation enables to ensure the dissolution stability of nickel formate even with a decreased blending amount of the 3-amino-1-propanol. Only, the viscosity of ethylene glycol is as slightly high as about 21 mPa·s, such that combined usage of ethylene glycol with the above-described low viscosity dialkylene glycol monoalkyl ether (alkylene: ethylene, propylene, and alkyl: methyl, ethyl) enables obtainment of a coating liquid (nickel formate: 5 to 10 wt %, amine based solvent: 5 to 10 wt %, ethylene glycol: 5 to 15 wt %, dialkylene glycol monoalkyl ether: 65 to 75 wt %, and others: small amounts) which is less in blending amount of amine based solvent, low in viscosity, and excellent in film-forming ability.

Glycol solvents other than ethylene glycol, such as diethylene glycol, triethylene glycol, tetraethylene glycol, propylene glycol, dipropylene glycol, tripropylene glycol, and the like, exhibit substantially no capabilities to assist nickel formate in dissolution, and only ethylene glycol has a unique capability.

Here, although water as a solvent other than an amine based solvent is necessarily contained in the coating liquid for nickel film formation when nickel formate hydrate [Ni(COOH)$_2$·2H$_2$O] is used as a source material of nickel formate, also water has a capability to enhance solubility and stability of nickel formate at a degree lower than ethylene glycol, so that further addition of water is allowed such that the content of water in the coating liquid for nickel film formation is 25 wt % or less (preferably 20 wt % or less). Contents of water exceeding 25 wt % are undesirably tend to deteriorate dissolution stability of nickel formate, though the reason thereof is unknown.

The coating liquid, which blendedly includes therein the amine based solvent, dialkylene glycol monoalkyl ether (alkylene: ethylene and propylene, and alkyl: methyl, ethyl, and propyl), ethylene glycol, water, and the like, and which is low in viscosity and excellent in film-forming ability, is suitable for various coating methods such as spin coating, and particularly optimum for inkjet printing.

Examples of the surfactant and high polymer utilizable in the present invention include silicone based, fluorine based, and amine based surfactants, acrylic high polymers, which are desirably combustible or thermally decomposable if possible. Examples of the silicone based surfactants include: one having a hydrophobic group constituted of dimethylpolysiloxane and a hydrophilic group constituted of polyalkyleneoxide; and one including various functional groups introduced into parts thereof; which each have an HLB (hydrophile-lipophile balance) value of 10 to 20. HLB values less than 10 lead to a tendency of insufficient uniformity of a film obtained by coating and film-formation of the coating liquid for nickel film formation, and are thus undesirable. Typically, silicone based surfactants having HLB values exceeding 20 are not commercially available, and it is difficult to obtain them.

Here, the HLB (hydrophile-lipophile balance) value is a kind of index representing a nature of a surfactant such that the HLB value represents a balance between hydrophilicity and lipophilicity in a manner that higher HLB values represent more water-soluble and lower HLB values approach more oil-soluble.

As the above-described functional groups, amino groups and amine groups are desirable, from a standpoint to improve a solubility of the surfactant in the amine based solvent and the dissolution stability of nickel formate. Here, examples of the amine based surfactant preferably include alkylamine acetate (RHNH$_2$.HOOCCH$_3$; R: alkyl group), since it excellently keeps liquid stability of the coating liquid for nickel film formation and it is also thermally decomposable.

The surfactant and high polymer are each desirably added in an amount of 0.01 to 3.0 parts by weight, preferably 0.02 to 0.5 parts by weight relative to 100 parts by weight of nickel formate [Ni(HCOO)$_2$]. This is because, amounts less than 0.01 parts by weight fail to exhibit an effect of addition, and amounts exceeding 3.0 parts by weight enable exhibition of the effect to improve the film-forming ability, but the surfactant or high polymer component is interposed among nickel fine particles in the course of nickel film formation to obstruct particle growth and particle contact, thereby possibly and undesirably deteriorating electroconductivity of the obtained nickel film.

The coating liquid for nickel film formation to be used in the present invention can be prepared by heatingly dissolving nickel formate in an amine based solvent. Further, it is possible to add thereto a binder component, the above-described organic solvent, and the like as required, as described above. The condition of the heating dissolution is such that stirring is conducted for about 10 to 60 minutes when the heating dissolution temperature is set at 50 to 160° C., for example. Heating dissolution temperatures below 50° C. are inefficient though dissolution can be narrowly achieved by an elapse of long time, and heating dissolution temperatures higher than 160° C. undesirably lead to considerable evaporation of the amine based solvent to change the nickel formate concentration. Further, the nickel film of the present invention can be produced by coating and drying the coating liquid for nickel film formation onto and on a substrate, followed by calcining.

Examples of coating methods utilizable in the present invention include various ones such as spin coating, wirebar coating, dip coating, screen printing, inkjet printing, and among them, the coating method based on inkjet printing is desirable in that it is capable of directly forming a fine pattern with an excellent resolution.

Since inkjet printing is configured to jet an ink from a nozzle onto a substrate to thereby form a coating film pattern thereon, the viscosity [value measured at room temperature] of the coating liquid is usually required to be set in a range of about 5 to 30 mPa·s (preferably 5 to 20 mPa·s, more preferably 5 to 15 mPa·s). Since this proper viscosity refers to the viscosity of ink within an inkjet head, it is possible to adopt an ink having a higher viscosity (which means a viscosity at room temperature) in an apparatus having a built-in heater in an inkjet head. Further, in order to avoid clogging at a nozzle portion due to dryout of a solvent, it is required to use a solvent having a relatively high boiling point (for example, boiling point: 100° C. or higher).

Based on the above reasons, drying of the coating liquid for nickel film formation coated on the substrate is to be conducted at a temperature of 150° C., preferably 150 to 220° C., and more preferably 180 to 220° C., for the substrate having the coating liquid coated thereon. Only, drying can be conducted even below 150° C. depending on the conditions, to obtain an excellent nickel film. Drying is to be preferably kept for a time of 10 to 60 minutes. Usable as a drying atmosphere is a neutral atmosphere such as atmospheric air or nitrogen gas.

Calcining is conducted by introducing the coated substrate after drying into a calcining furnace, typically followed by heating at about 240° C. or higher which is a decomposition temperature of nickel formate, desirably 300° C. or higher, for 30 to 120 minutes. The decomposition temperature of nickel formate can be lowered by adding a small amount (about 0.01 to 0.1 parts by weight relative to 100 parts by weight of nickel) of a thermal decomposition promoter such as a palladium compound (palladium acetate, for example) into the coating liquid for nickel film formation, thereby enabling the calcining temperature to be further lowered by about 5 to 15° C. Only, depending on the kind and adding amount of the thermal decomposition promoter, fine particles may be caused due to a decomposition promoting function of the promoter when the standing time of the coating liquid at the room temperature is extended, and it is thus necessary in this case to blend the thermal decomposition promoter into the coating liquid for nickel film formation just prior to usage thereof.

Higher calcining temperatures lead to an improved electroconductivity of a nickel film, since particle growth of nickel particles are promoted then. Although the calcining atmosphere may be a neutral atmosphere such as nitrogen gas, argon gas, or the like, reducing atmospheres such as hydrogen gas, hydrogen/nitrogen mixed gas, and the like are desirable in that they are each capable of completely restricting oxidation of nickel particles to promote sintering among nickel particles themselves, thereby further improving electroconductivity. Further, calcining in a reducing atmosphere enables reduction of nickel formate into nickel even at a temperature at or below the decomposition temperature of nickel formate, thereby enabling obtainment of a nickel film by calcining even at a low temperature of about 200 to 230° C., for example, though the calcining time is extended then.

Example 1

Nickel formate [$Ni(HCOO)_2 \cdot 2H_2O$]: 10 g and 3-amino-1-propanol (boiling point: 188° C.): 40 g were mixed with each other followed by heating dissolution at 80° C., and then dimethyl acetamide: 49.8 g and alkylamine acetate ($RHNH_2 \cdot HOOCCH_3$; R: alkyl group having a carbon chain length distribution of 8 to 18): 0.2 g as an amine based surfactant were mixed into and dissolved in the mixture, thereby obtaining a coating liquid for nickel film formation according to Example 1 which was a blue and transparent solution.

This coating liquid for nickel film formation had a viscosity of 10.1 mPa·s [value measured at 25±2° C.], and any change in external appearance of the ink including deposition of nickel formate or the like was not recognized even when the coating liquid was left to stand at a room temperature for one week. When the coating liquid for nickel film formation was inkjet printed onto a soda-lime glass substrate, the ink jetting ability was excellent without nozzle clogging, and the formed coating film was also excellent in coatability, thereby proving that the coating liquid can be inkjet printed satisfactorily. Note that the viscosity of the coating liquid for nickel film formation was measured by a vibration viscometer VM-100-L manufactured by CBC Co., Ltd.

Since it is difficult to conduct solid printing of a large area by inkjet printing and then it becomes difficult to collect a sample for evaluation of characteristics (transmittance, haze, and surface resistivity) of a nickel film to be described later, formation of nickel film was conducted by spin coating and this film was used as an evaluation sample. Namely, the coating liquid for nickel film formation was spin coated (250 rpm×60 sec) onto a whole surface of a soda-lime glass substrate (10 cm×10 cm×3 mm thickness), followed by drying at 180° C. for 30 minutes, and then calcining at 300° C. for 60 minutes in an atmosphere of 2% hydrogen and 98% nitrogen, thereby obtaining a nickel film according to Example 1. The nickel film had a uniform external appearance as seen from an optical microphotograph shown in FIG. 1, and the external appearance was also uniform by visual inspection without any coating film defects and the like. The nickel film had a thickness of about 90 nm. Note that the same coating liquid for nickel film formation was used for the nickel films to be obtained by inkjet printing and spin coating, so that the film characteristics of the nickel films were to be the same.

Example 2

Nickel formate [$Ni(HCOO)_2 \cdot 2H_2O$]: 10 g and 3-amino-1-propanol (boiling point: 188° C.): 40 g were mixed with each other followed by heating dissolution at 80° C., and then dimethyl acetamide: 49.88 g, a silicone based surfactant (L-7604 manufactured by Dow Corning Toray Silicone Co., Ltd., HLB value=13): 0.02 g, and a silicon coupling agent (N-(2-aminoethyl)-3-aminopropyl-trimethoxysilane): 0.1 g as a binder component were mixed into and dissolved in the mixture, thereby obtaining a coating liquid for nickel film formation according to Example 2 which was a blue and transparent solution. This coating liquid for nickel film formation had a viscosity of 9.8 mPa·s [value measured at 25±2° C.], and any change in external appearance of the ink including deposition of nickel formate or the like was not recognized even when the coating liquid was left to stand at a room temperature for one week. When the coating liquid for nickel film formation was inkjet printed onto a soda-lime glass substrate, the ink jetting ability was excellent without nozzle clogging, and the formed coating film was also excellent in coatability, thereby proving that the coating liquid can be inkjet printed satisfactorily.

There was conducted the same procedure as Example 1 except for adoption of the coating liquid for nickel film formation described just above, to obtain a nickel film according to Example 2. The nickel film had an external appearance which was uniform by visual inspection without coating film defects and the like. The nickel film had a thickness of about 110 nm.

Example 3

Nickel formate [Ni(HCOO)$_2$.2H$_2$O]: 10 g and 3-amino-1-propanol (boiling point: 188° C.): 40.0 g were mixed with each other followed by heating dissolution at 80° C., and then dimethyl acetamide: 49.68 g, a silicone based surfactant (FZ-2162 manufactured by Dow Corning Toray Silicone Co., Ltd., HLB value=11): 0.02 g, and a silicon coupling agent (3-aminopropyl-trimethoxysilane): 0.3 g as a binder component were mixed into and dissolved in the mixture, thereby obtaining a coating liquid for nickel film formation according to Example 3 which was a blue and transparent solution. This coating liquid for nickel film formation had a viscosity of 9.9 mPa·s [value measured at 25±2° C.], and any change in external appearance of the ink including deposition of nickel formate or the like was not recognized even when the coating liquid was left to stand at a room temperature for one week. When the coating liquid for nickel film formation was inkjet printed onto a soda-lime glass substrate, the ink jetting ability was excellent without nozzle clogging, and the formed coating film was also excellent in coatability, thereby proving that the coating liquid can be inkjet printed satisfactorily.

There was conducted the same procedure as Example 1 except for adoption of the coating liquid for nickel film formation described just above, to obtain a nickel film according to Example 3. The nickel film had an external appearance which was uniform by visual inspection without coating film defects and the like. The nickel film had a thickness of about 115 nm.

Example 4

Nickel formate [Ni(HCOO)$_2$.2H$_2$O]: 10 g and 3-amino-1-propanol (boiling point: 188° C.): 40.0 g were mixed with each other followed by heating dissolution at 80° C., and then dimethyl acetamide: 49.68 g, a silicone based surfactant (FZ-2161 manufactured by Dow Corning Toray Silicone Co., Ltd., HLB value=16): 0.02 g, and a titanate coupling agent (isopropyl-tri(N-aminoethyl-aminoethyl) titanate): 0.3 g as a binder component were mixed into and dissolved in the mixture, thereby obtaining a coating liquid for nickel film formation according to Example 4 which was a blue and transparent solution. This coating liquid for nickel film formation had a viscosity of 9.8 mPa·s [value measured at 25±2° C.], and any change in external appearance of the ink including deposition of nickel formate or the like was not recognized even when the coating liquid was left to stand at a room temperature for one week. When the coating liquid for nickel film formation was inkjet printed onto a soda-lime glass substrate, the ink jetting ability was excellent without nozzle clogging, and the formed coating film was also excellent in coatability, thereby proving that the coating liquid can be inkjet printed satisfactorily.

There was conducted the same procedure as Example 1 except for adoption of the coating liquid for nickel film formation described just above, to obtain a nickel film according to Example 4. The nickel film had an external appearance which was uniform by visual inspection without coating film defects and the like. The nickel film had a thickness of about 105 nm.

Example 5

Nickel formate [Ni(HCOO)$_2$.2H$_2$O]: 10 g and 3-amino-1-propanol (boiling point: 188° C.): 20.0 g were mixed with each other followed by heating dissolution at 80° C., and then diethylene glycol monoethyl ether: 69.48 g, a silicone based surfactant (L-7604 manufactured by Dow Corning Toray Silicone Co., Ltd., HLB value=13): 0.02 g, and a titanate coupling agent (isopropyl-tri(N-aminoethyl-aminoethyl) titanate): 0.5 g as a binder component were mixed into and dissolved in the mixture, thereby obtaining a coating liquid for nickel film formation according to Example 5 which was a blue and transparent solution. This coating liquid for nickel film formation had a viscosity of 16.8 mPa·s [value measured at 25±2° C.], and any change in external appearance of the ink including deposition of nickel formate or the like was not recognized even when the coating liquid was left to stand at a room temperature for one week. When the coating liquid for nickel film formation was inkjet printed onto a soda-lime glass substrate, the ink jetting ability was excellent without nozzle clogging, and the formed coating film was also excellent in coatability, thereby proving that the coating liquid can be inkjet printed satisfactorily.

There was conducted the same procedure as Example 1 except that the coating liquid for nickel film formation described just above was adopted, and that drying was conducted at 200° C. for 30 minutes after spin coating, followed by calcining at 300° C. for 30 minutes in an atmosphere of 2% hydrogen and 98% nitrogen, to obtain a nickel film according to Example 5. The nickel film had an external appearance which was uniform by visual inspection without coating film defects and the like. The nickel film had a thickness of about 140 nm.

Example 6

Nickel formate [Ni(HCOO)$_2$.2H$_2$O]: 8 g and 3-amino-1-propanol (boiling point: 188° C.): 16.0 g were mixed with each other followed by heating dissolution at 80° C., and then diethylene glycol monoethyl ether: 75.58 g, a silicone based surfactant (L-7604 manufactured by Dow Corning Toray Silicone Co., Ltd., HLB value=13): 0.02 g, and a titanate coupling agent (isopropyl-tri(N-aminoethyl-aminoethyl) titanate): 0.4 g as a binder component were mixed into and dissolved in the mixture, thereby obtaining a coating liquid for nickel film formation according to Example 6 which was a blue and transparent solution. This coating liquid for nickel film formation had a viscosity of 11.7 mPa·s [value measured at 25±2° C.], and any change in external appearance of the ink including deposition of nickel formate or the like was not recognized even when the coating liquid was left to stand at a room temperature for one week. When the coating liquid for nickel film formation was inkjet printed onto a soda-lime glass substrate, the ink jetting ability was excellent without nozzle clogging, and the formed coating film was also excellent in coatability, thereby proving that the coating liquid can be inkjet printed satisfactorily.

There was conducted the same procedure as Example 5 except for adoption of the coating liquid for nickel film formation described just above, to obtain a nickel film according to Example 6. The nickel film had an external appearance which was uniform by visual inspection without coating film defects and the like. The nickel film had a thickness of about 104 nm.

Example 7

There was conducted the same procedure as Example 6 except for calcining at 250° C. for 30 minutes in an atmosphere of 2% hydrogen and 98% nitrogen, to obtain a nickel film according to Example 7. The nickel film had an external appearance which was uniform by visual inspection without coating film defects and the like. The nickel film had a thickness of about 110 nm.

Example 8

Nickel formate [Ni(HCOO)$_2$.2H$_2$O]: 8 g, 3-amino-1-propanol (boiling point: 188° C.): 8.0 g, and ethylene glycol: 10 g were mixed with one another followed by heating dissolution at 80° C., and then diethylene glycol monoethyl ether: 73.58 g, a silicone based surfactant (L-7604 manufactured by Dow Corning Toray Silicone Co., Ltd., HLB value=13): 0.02 g, and a titanate coupling agent (isopropyl-tri(N-aminoethyl-aminoethyl) titanate): 0.4 g as a binder component were mixed into and dissolved in the mixture, thereby obtaining a coating liquid for nickel film formation according to Example 8 which was a blue and transparent solution. This coating liquid for nickel film formation had a viscosity of 9.6 mPa·s [value measured at 25±2° C.], and any change in external appearance of the ink including deposition of nickel formate or the like was not recognized even when the coating liquid was left to stand at a room temperature for one week. When the coating liquid for nickel film formation was inkjet printed onto a soda-lime glass substrate, the ink jetting ability was excellent without nozzle clogging, and the formed coating film was also excellent in coatability, thereby proving that the coating liquid can be inkjet printed satisfactorily.

There was conducted the same procedure as Example 5 except for adoption of the coating liquid for nickel film formation described just above, to obtain a nickel film according to Example 8. The nickel film had an external appearance which was uniform by visual inspection without coating film defects and the like. The nickel film had a thickness of about 100 nm.

Example 9

Nickel formate [Ni(HCOO)$_2$.2H$_2$O]: 8 g and 3-amino-1-propanol (boiling point: 188° C.): 16.0 g were mixed with each other followed by heating dissolution at 80° C., and then 0.25% palladium acetate solution: 1 g, diethylene glycol monoethyl ether: 74.58 g, a silicone based surfactant (L-7604 manufactured by Dow Corning Toray Silicone Co., Ltd., HLB value=13): 0.02 g, and a titanate coupling agent (isopropyl-tri(N-aminoethyl-aminoethyl) titanate): 0.4 g as a binder component were mixed into and dissolved in the mixture, thereby obtaining a coating liquid for nickel film formation according to Example 9 which was a blue and transparent solution. This coating liquid for nickel film formation had a viscosity of 11.6 mPa·s [value measured at 25±2° C.], and any change in external appearance of the ink including deposition of nickel formate or the like was not recognized even when the coating liquid was left to stand at a room temperature for one week. When the coating liquid for nickel film formation was inkjet printed onto a soda-lime glass substrate, the ink jetting ability was excellent without nozzle clogging, and the formed coating film was also excellent in coatability, thereby proving that the coating liquid can be inkjet printed satisfactorily.

There was conducted the same procedure as Example 1 except for calcining at 230° C. for 60 minutes in an atmosphere of 2% hydrogen and 98% nitrogen, to obtain a nickel film according to Example 9. The nickel film had an external appearance which was uniform by visual inspection without coating film defects and the like. The nickel film had a thickness of about 105 nm.

Example 10

Nickel formate [Ni(HCOO)$_2$.2H$_2$O]: 8 g and 3-amino-1-propanol (boiling point: 188° C.): 16.0 g were mixed with each other followed by heating dissolution at 80° C., and then diethylene glycol monomethyl ether: 75.58 g, a silicone based surfactant (L-7604 manufactured by Dow Corning Toray Silicone Co., Ltd., HLB value=13): 0.02 g, and a titanate coupling agent (isopropyl-tri(N-aminoethyl-aminoethyl) titanate): 0.4 g as a binder component were mixed into and dissolved in the mixture, thereby obtaining a coating liquid for nickel film formation according to Example 10 which was a blue and transparent solution. This coating liquid for nickel film formation had a viscosity of 10.9 mPa·s [value measured at 25±2° C.], and any change in external appearance of the ink including deposition of nickel formate or the like was not recognized even when the coating liquid was left to stand at a room temperature for one week. When the coating liquid for nickel film formation was inkjet printed onto a soda-lime glass substrate, the ink jetting ability was excellent without nozzle clogging, and the formed coating film was also excellent in coatability, thereby proving that the coating liquid can be inkjet printed satisfactorily.

There was conducted the same procedure as Example 5 except for adoption of the coating liquid for nickel film formation described just above, to obtain a nickel film formation according to Example 10. The nickel film had an external appearance which was uniform by visual inspection without coating film defects and the like. The nickel film had a thickness of about 101 nm.

Example 11

Nickel formate [Ni(HCOO)$_2$.2H$_2$O]: 8 g and 3-amino-1-propanol (boiling point: 188° C.): 16.0 g were mixed with each other followed by heating dissolution at 80° C., and then dipropylene glycol monomethyl ether: 75.58 g, a silicone based surfactant (L-7604 manufactured by Dow Corning Toray Silicone Co., Ltd., HLB value=13): 0.02 g, and a titanate coupling agent (isopropyl-tri(N-aminoethyl-aminoethyl) titanate): 0.4 g as a binder component were mixed into and dissolved in the mixture, thereby obtaining a coating liquid for formulated nickel film formation according to Example 11 which was a blue and transparent solution. This coating liquid for nickel film formation had a viscosity of 10.5 mPa·s [value measured at 25±2° C.], and any change in external appearance of the ink including deposition of nickel formate or the like was not recognized even when the coating liquid was left to stand at a room temperature for one week. When the coating liquid for nickel film formation was inkjet printed onto a soda-lime glass substrate, the ink jetting ability was excellent without nozzle clogging, and the formed coating film was also excellent in coatability, thereby proving that the coating liquid can be inkjet printed satisfactorily.

There was conducted the same procedure as Example 5 except for adoption of the coating liquid for nickel film formation described just above, to obtain a nickel film according to Example 11. The nickel film had an external appearance which was uniform by visual inspection without coating film defects and the like. The nickel film had a thickness of about 103 nm.

Comparative Example 1

Nickel formate [Ni(HCOO)$_2$.2H$_2$O]: 10 g and 2-aminoethanol (boiling point: 171° C.): 40 g were mixed with each other followed by heating dissolution at 80° C., and then dimethyl acetamide: 49.8 g, and alkylamine acetate ($RHNH_2$ $HOOCCH_3$; R: alkyl group having a carbon chain length distribution of 8 to 18): 0.2 g as a surfactant were mixed into and dissolved in the mixture, thereby obtaining a coating liquid for nickel film formation according to Comparative Example 1 which was a blue and transparent solution. This coating liquid for nickel film formation had a viscosity of 8:0 mPa·s [value measured at 25±2° C.], and any change in external appearance of the ink including deposition of nickel formate or the like was not recognized even when the coating liquid was left to stand at a room temperature for one week. When the coating liquid for nickel film formation was inkjet printed onto a soda-lime glass substrate, the ink jetting ability was excellent without nozzle clogging, and the formed coating film was also excellent in coatability, thereby proving that the coating liquid can be inkjet printed satisfactorily.

There was conducted the same procedure as Example 1 except for adoption of the coating liquid for nickel film formation described just above, to obtain a nickel film. Since the drying temperature was 180° C. which is higher than a boiling point of 2-aminoethanol as the solvent, drying of the film was non-uniform, thereby resulting in the nickel film according to Comparative Example 1 which was formed with coating film defects (in sizes of 0.2 mm to several millimeters in a mottled pattern) to an extent easily recognized by visual inspection. FIG. 2 shows an optical microphotograph of an external appearance of the nickel film. Since this nickel film was non-uniform, measurement was not conducted for part of film characteristics (film thickness and specific resistance). Although the film was non-uniform in terms of transmittance, measurement thereof was conducted in the sense of comparison with respective Examples since the transmittance measuring method to be described later is configured to obtain an averaged value for an area having a diameter of 20 mm.

Comparative Example 2

Nickel formate [$Ni(HCOO)_2 \cdot 2H_2O$]: 10 g and 1-amino-2-propanol (boiling point: 160° C.): 40 g were mixed with each other followed by heating dissolution at 80° C., and then dimethyl acetamide: 49.8 g, a alkylamine ($RHNH_2$ $HOOCCH_3$; R: alkyl group having a carbon chain length distribution of 8 to 18): 0.2 g as a surfactant were mixed into and dissolved in the mixture, thereby obtaining a coating liquid for nickel film formation according to Comparative Example 2 which was a blue and transparent solution. This coating liquid for nickel film formation had a viscosity of 8.9 mPa·s [value measured at 25±2° C.], and any change in external appearance of the ink including deposition of nickel formate or the like was not recognized even when the coating liquid was left to stand at a room temperature for one week.

When the coating liquid for nickel film formation was inkjet printed onto a soda-lime glass substrate, the ink jetting ability was excellent without nozzle clogging, and the formed coating film was also excellent in coatability, thereby proving that the coating liquid can be inkjet printed satisfactorily.

Although there was conducted the same procedure as Example 1 except for adoption of the coating liquid for nickel film formation described just above, the drying temperature was 180° C. which is higher than a boiling point of 1-amino-2-propanol as the solvent, so that drying of the film was non-uniform, thereby resulting in the nickel film according to Comparative Example 2 which was formed with coating film defects (in sizes of several millimeters or larger in an mottled pattern) to an extent easily recognized by visual inspection. Since this nickel film was non-uniform, measurement was not conducted for part of film characteristics (film thickness and specific resistance). Although the film was non-uniform in terms of transmittance, measurement thereof was conducted in the sense of comparison with respective Examples since the transmittance measuring method to be described later is configured to obtain an averaged value for an area having a diameter of 20 mm.

For the thus obtained Examples and Comparative Examples, there were measured a surface resistivity (in Q/O (ohm per square), a specific resistance, a visible light transmittance, a film strength (adhesion force), and a surface roughness (Ra), and the results are listed in Table 1. Film thickness was measured by a stylus-based surface profiler (Alpha-Step IQ) manufactured by KLA-Tencor Corporation, surface resistivity by a surface resistivity meter LORESTA AP (MCP-T400) manufactured by Mitsubishi Chemical Corporation, visible light transmittance by a hazemeter (HR-200) manufactured by MURAKAMI COLOR RESEARCH LABORATORY Co., Ltd., and surface roughness (Ra) by an AFM (NS-III, D5000 system) manufactured by DI for an area of 20 μm×20 μm (concerning surface roughness of Comparative Examples 1 and 2, although films were non-uniform such that measured values seemed to be different depending on measuring locations, measurement was conducted in the sense of comparison with respective Examples). Film strength (adhesion force) was evaluated by a tape peeling test (cross-cut test) in conformity to JIS K5600-5-6.

Note that the transmittance of nickel film was a (visible light) transmittance of a nickel film only, and obtained in the following manner. Namely, Transmittance (%) of nickel film=[(transmittance measured for nickel film together with glass substrate)/(transmittance of glass substrate)]×100

The specific resistance of nickel film was obtained in the following manner. Namely, Specific resistance (mΩ·cm) of nickel film=[surface resistivity (Ω/□) of nickel film]×[nickel film thickness (μm)]×0.1

TABLE 1

| | Film Thickness (nm) | Surface resistivity (Ω/□) | Specific resistance (mΩ · cm) | Visible Light transmittance (%) | Film strength (note 1) | Surface roughness Ra (nm) |
|---|---|---|---|---|---|---|
| Ex. 1 | 90 | 6.8 | 0.06 | 5.0 | 20/25 | 3.3 |
| Ex. 2 | 110 | 14 | 0.15 | 2.8 | 25/25 | 3.1 |
| Ex. 3 | 115 | 16 | 0.18 | 3.0 | 25/25 | 3.1 |
| Ex. 4 | 105 | 10 | 0.11 | 2.8 | 25/25 | 2.9 |
| Ex. 5 | 140 | 13 | 0.18 | 2.7 | 25/25 | 3.3 |
| Ex. 6 | 104 | 32 | 0.33 | 9.4 | 25/25 | 1.3 |
| Ex. 7 | 110 | 40 | 0.44 | 11.6 | 25/25 | 1.6 |
| Ex. 8 | 100 | 14 | 0.14 | 7.9 | 25/25 | 2.3 |
| Ex. 9 | 105 | 52 | 0.55 | 12.5 | 25/25 | 3.5 |
| Ex. 10 | 101 | 33 | 0.33 | 9.1 | 25/25 | 1.5 |
| Ex. 11 | 103 | 31 | 0.32 | 8.9 | 25/25 | 1.8 |
| Com. Ex. 1 | — | 42 | — | 7.2 | 20/25 | 12.4 |
| Com. Ex. 2 | — | 1020 | — | 4.7 | 20/25 | 15.2 |

Note 1: (number of samples without peeling)/(number of all samples) (5 × 5 = 25 samples)

"Evaluation"

As apparent from comparison of Examples with Comparative Examples, the coating liquids for nickel film formation of Examples containing nickel formate and amine based solvents having boiling points between 180° C. inclusive and 300° C. exclusive are suitable for inkjet printing, are free of change of external appearance of ink, and are simultaneously capable of forming uniform and flat nickel films which are low in resistance and excellent in film strength (adhesion force). Contrary, the nickel films obtained by using the coating liquids for nickel film formation of Comparative Examples each exhibit such a problem that the film thickness is considerably non-uniform, and resistance value and film smoothness are much deteriorated.

INDUSTRIAL APPLICABILITY

The coating liquid for nickel film formation according to the present invention can be utilized by inkjet printing in a manner to allow for formation of a fine pattern of nickel film on a substrate with excellent resolution, and the thus obtained nickel film is excellent in electroconductivity, uniformity, flatness, and strength, so that the coating liquid for nickel film formation is utilizable for production of electronic elements such as signal electrodes of display devices such as liquid crystal display (LCD), electroluminescence device (ELD), and plasma display (PDP), and wider utilization can be additionally expected including electrodes of various circuit boards.

Figure 1:
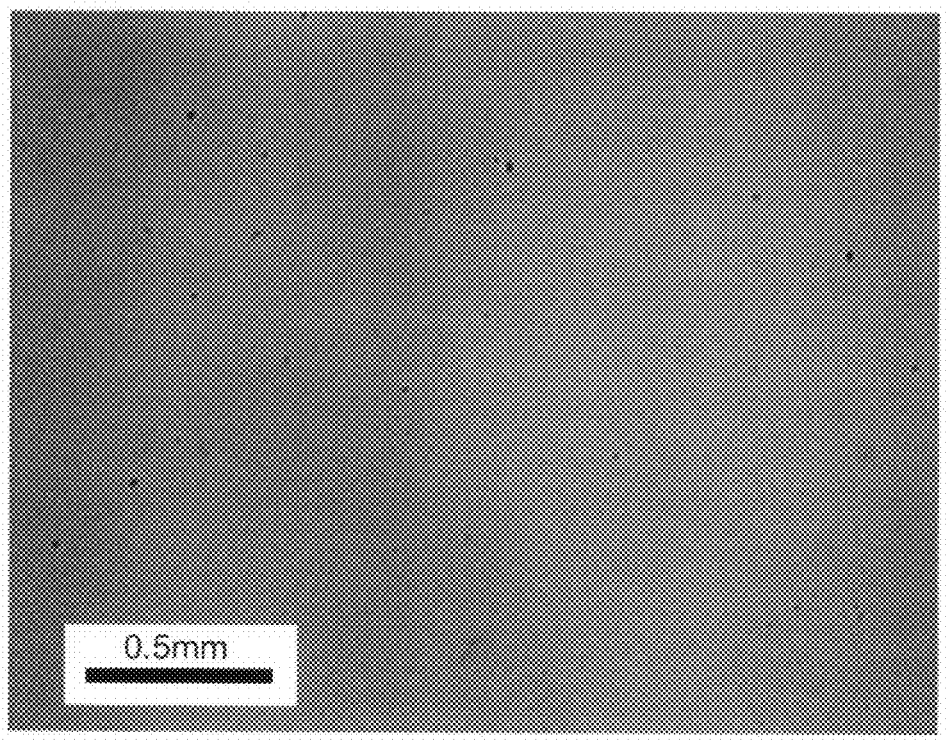
FIG. 1 is an optical microphotograph of an external appearance of a nickel film according to Example 1.
Figure 2:
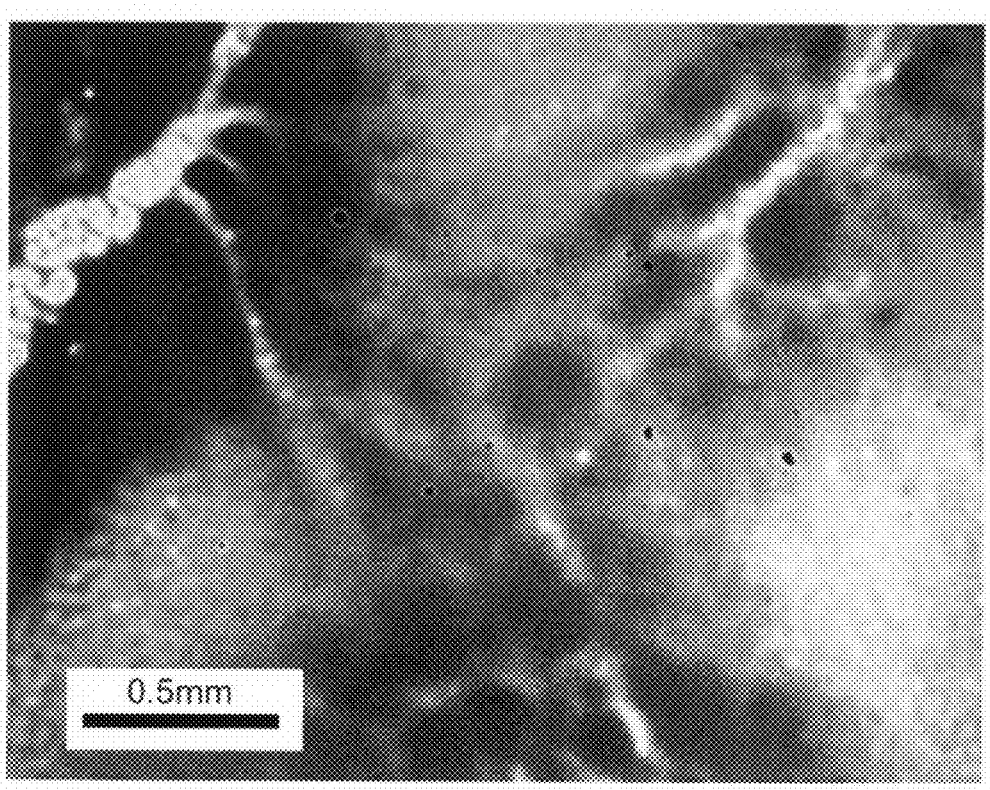
FIG. 2 is an optical microphotograph of an external appearance of a nickel film according to Comparative Example 1.

The invention claimed is:

1. A coating liquid for nickel film formation comprising:
nickel formate and a solvent which comprises an amine-based solvent having a boiling point within a range between 180° C. inclusive and 300° C. exclusive, a non-aqueous solvent other than the amine-based solvent, and water;
wherein
the amine-based solvent is 3-amino-1 propanol (boiling point: 188° C.),
the non-aqueous solvent other than the amine-based solvent is selected from the group consisting of dimethyl acetamide, ethylene glycol, dialkylene glycol monoalkyl ether,
and wherein a coating liquid contains greater than zero and less than 25 wt % of water.

2. The coating liquid for nickel film formation of claim 1, further comprising a binder component and/or surfactant.

3. The coating liquid for nickel film formation of claim 2, wherein the binder component has an amino group ($—NH_2$), an amine group obtained by substituting one, two, or three hydrogen atoms of ammonia with one, two or three alkyl groups or aryl groups.

4. The coating liquid for nickel film formation of claim 2, wherein the surfactant is a silicone based surfactant having an hydrophilic-lipophilic balance (HLB) value of 10 or more.

5. The coating liquid for nickel film formation of claim 1, further comprising a thermal decomposition promoter.

6. The coating liquid for nickel film formation of claim 5, wherein the thermal decomposition promoter is a palladium compound.

7. The coating liquid for nickel film formation of claim 1, wherein the coating liquid for nickel film formation having a viscosity within a range of 5 to 30 mPa·s at a room temperature.

8. A nickel film production method comprising the steps of:
coating the coating liquid for nickel film formation of claim 1 onto a substrate;
drying the coated coating liquid; and
subsequently calcining the dried coating liquid at a temperature of 200° C. or higher in an inert atmosphere or reducing atmosphere.

9. The nickel film production method of claim 8, wherein the drying step is conducted at a temperature of 150° C. or higher.

10. The nickel film production method of claim 8, wherein the coating step is conducted by inkjet printing.

11. A nickel film obtained by the nickel film production method of claim 8.

12. The nickel film of claim 11, wherein the nickel film has a specific resistance of 10 mΩ·cm or less.

* * * * *